United States Patent [19]
Bergemont et al.

[11] Patent Number: 5,998,280
[45] Date of Patent: Dec. 7, 1999

[54] MODIFIED RECESSED LOCOS ISOLATION PROCESS FOR DEEP SUB-MICRON DEVICE PROCESSES

[75] Inventors: Albert Bergemont, Palo Alto; Alexander H. Owens, Los Gatos, both of Calif.

[73] Assignee: National Semiconductor Corporation, Santa Clara, Calif.

[21] Appl. No.: 09/045,226

[22] Filed: Mar. 20, 1998

[51] Int. Cl.$^6$ ................................................. H01L 21/76
[52] U.S. Cl. ........................ 438/425; 438/424; 438/426; 438/435; 438/444; 148/DIG. 50
[58] Field of Search .................................. 438/424, 425, 438/426, 435, 444; 148/DIG. 50

[56] References Cited

U.S. PATENT DOCUMENTS

| | | | |
|---|---|---|---|
| 4,842,675 | 6/1989 | Chapman et al. | 148/DIG. 50 |
| 5,498,566 | 3/1996 | Lee | 148/DIG. 50 |
| 5,679,602 | 10/1997 | Lin et al. | 148/DIG. 50 |
| 5,807,784 | 9/1998 | Kim | 438/423 |

OTHER PUBLICATIONS

S. Wolf in *Silicon Processing for the VLSI Era,* vol. 2, pp. 28–31 (Lattice Press, 1990).
S. Wolf in *Silicon Processing for the VLSI Era,* vol. 2, pp. 45–48 (Lattice Press, 1990).

*Primary Examiner*—Trung Dang
*Attorney, Agent, or Firm*—Skjerven, Morrill, MacPherson Franklin and Friel; Michael J. Halbert

[57] ABSTRACT

A trench is etched in a silicon substrate covered with an oxide/nitride stack and a field oxide layer is then grown through oxidation of the silicon in the substrate such that the trench is partly filled. There is reduced oxide encroachment into the active areas under the nitride layer because of the partial field oxide growth. Double oxide layers are deposited over the surface of the field oxide layer and the oxide/nitride stack such that the oxide layers fill the remainder of the trench and produce a nearly planar topology. The double oxide layers are then etched back to the nitride layer through chemical mechanical polishing, leaving the field isolation region. After stripping the oxide/nitride stack, a gate oxide layer is grown. A minimal amount of oxide is required to fill the trench because the trench is already almost filled with the field oxide layer and because of the shallow depth of the trench. Consequently, the etch back step causes minimal dishing. Further, the field oxide layer rounds the corner between the trench and the active area, obviating the need for a thin oxide liner in the trench.

16 Claims, 3 Drawing Sheets

MODIFIED RECESSED LOCOS ISOLATION PROCESS FOR DEEP SUB-MICRON DEVICE PROCESSES

FIELD OF THE INVENTION

The present invention relates to isolation regions used in semiconductor integrated circuits, and in particular to isolation regions used with deep sub-micron devices.

BACKGROUND

Isolation regions are commonly used in the semiconductor industry to prevent parasitic channels between adjacent devices. Two well-known processes of generating isolation regions are recessed local oxidation isolation ("RLOCOS") and shallow trench isolation ("STI"). However, both RLOCOS and STI processes have disadvantages that limit their respective utility, particularly where device geometry is in the sub-micron range.

A process for forming RLOCOS regions is described by S. Wolf in *Silicon Processing for the VLSI Era*, Vol. 2, pp. 28–31 (Lattice Press, 1990). Therefore, RLOCOS processing will only be briefly described. A silicon substrate, with a conventional oxide/nitride stack, is etched to form grooves in the silicon. Field oxide is then thermally grown in the etched grooves through oxidation. The field oxide grows both downward and upward, until the etched groove is completely filled with the field oxide. Once the field oxide is grown, the oxide/nitride stack is stripped and a gate oxide layer is thermally grown on the surface of the substrate.

Although RLOCOS is widely used, it has several disadvantages. For example, the scalability of RLOCOS technology in the submicron range is limited. Scalability is limited because a large amount of lateral oxide diffuses under the nitride layer during the field oxide growth, thus creating a structure known as bird's beak. A large bird's beak is undesirable because oxide encroachment into the active area reduces the packing density of devices on the substrate. Another limitation of the scalability of RLOCOS technology is the oxide field-thinning effect, which causes the field oxide thickness in sub-micron isolation regions to be significantly less than the thickness of field oxides grown in wider regions.

Moreover, the growth of the field oxide generates stresses at the bottom corners and the sidewalls of the etched grooves, as well as under the nitride layer because of the bird's beak. These stresses, along with the lack of planarity, can generate stacking fault formation and junction leakage at the bird's beak edge. Further, RLOCOS technology produces a bulge, known as a bird's head, in the field oxide near the nitride layer and, therefore, the RLOCOS isolation regions are not planar.

A shallow trench isolation process is also described by S. Wolf in *Silicon Processing for the VLSI Era*, Vol. 2, pp. 45–48 (Lattice Press, 1990). Accordingly, STI processing will be described briefly. A silicon substrate with a conventional oxide/nitride stack is etched to form a shallow trench, typically 3,500 Å deep. A high temperature oxide growth forms a thin oxide liner, approximately 200 Å thick. The shallow trench is then filled with an oxide layer through high temperature chemical vapor deposited (CVD). A second oxide layer is then deposited over the surface of substrate. The oxide layers are then etched back in order to planarize the surface. The oxide/nitride stack is then stripped, followed by a thermal growth of a gate oxide layer.

Standard STI technology has several disadvantages. The process itself is complex. For instance, the CVD oxide deposition into the trenches can create voids, particularly where the trenches are narrow. Thus, complex methods are used to prevent voids. Additionally, during the etch back step the field oxide is typically over etched causing "dishing", i.e., the field oxide surface becomes lower than the active area surface. Dishing creates problems because portions of the sidewall of the active areas are exposed, which leads to sidewall and edge-parasitic conduction. To prevent dishing, a reverse active area mask is used to protect the field isolation regions during the etch back step.

Another difficulty occurs at the trench edge, where the gate oxide becomes thin. Thinning of the gate oxide layer degrades the gate oxide reliability as well as increases edge-parasitic effects. The thin oxide layer that is deposited prior to deposition of the field oxide is intended to prevent these problems. The thin oxide layer typically results in a seam between the thin oxide layer and the deposited field oxide.

SUMMARY

An isolation region is formed by etching a trench in a silicon substrate having an oxide/nitride stack, and partly filling the trench with a field oxide layer. The field oxide layer is grown directly from the silicon to no less then 2500 Å thick. Because the field oxide layer is grown directly from the silicon in the substrate, there is no need for the thin oxide layer used in STI processing. Further, there is reduced oxide encroachment under the nitride layer because the trench is not completely filled with the grown field oxide layer. Because oxide encroachment is proportional to the size of the oxide growth, a thin oxide growth will generate little encroachment. Double oxide layers are then deposited over the surface of the substrate and the field oxide layer to completely fill the remainder of the trench and to create an approximately planar topology. Because the growth of the field oxide layer filled most of the trench, the amount of double oxide needed to fill the remainder of the trench and to present an approximately planar topology is minimal relative to conventional STI processing. The double oxide layers are then etched back to the nitride layer. Only a minimal amount of etching is required in the etch back step because a small amount of deposited oxide is used to fill the trench. Consequently, the present process causes less dishing than is typically caused in standard STI processing. The oxide/nitride stack is then etched away and a gate oxide layer is thermally grown.

BRIEF DESCRIPTION OF THE DRAWINGS

The present invention may be better understood and its numerous objects, features and advantages made apparent to those skilled in the art by referring to the accompanying drawings in which like components are referenced by like characters.

DETAILED DESCRIPTION

Figure 1:
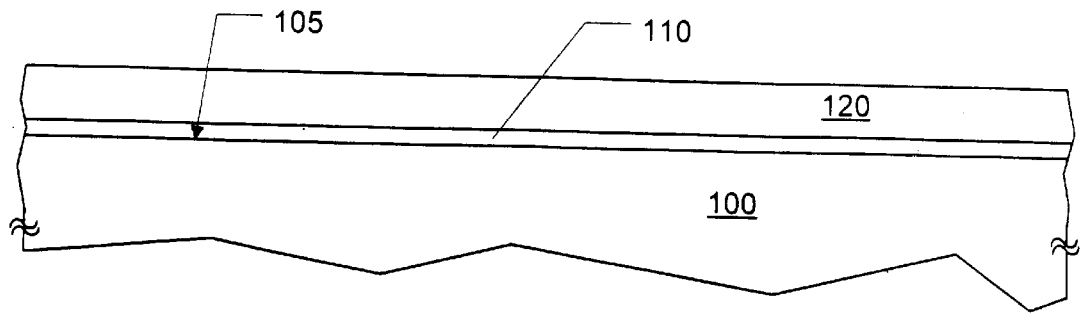
FIGS. 1–8 are simplified cross-sectional views of a semiconductor substrate in various stages in the fabrication of a field oxide isolation region in accordance with the present invention.

FIG. 1 shows a semiconductor substrate 100, such as an N type silicon wafer, with a conventional oxide/nitride stack. The pad oxide layer 110 is conventionally grown by thermal oxidation to a thickness of approximately 80–100 Å on the surface 105 of substrate 100. The nitride layer 120 is deposited over pad oxide layer 110 to an approximately thickness of 2000 Å, by CVD or other conventional methods.

Figure 2:
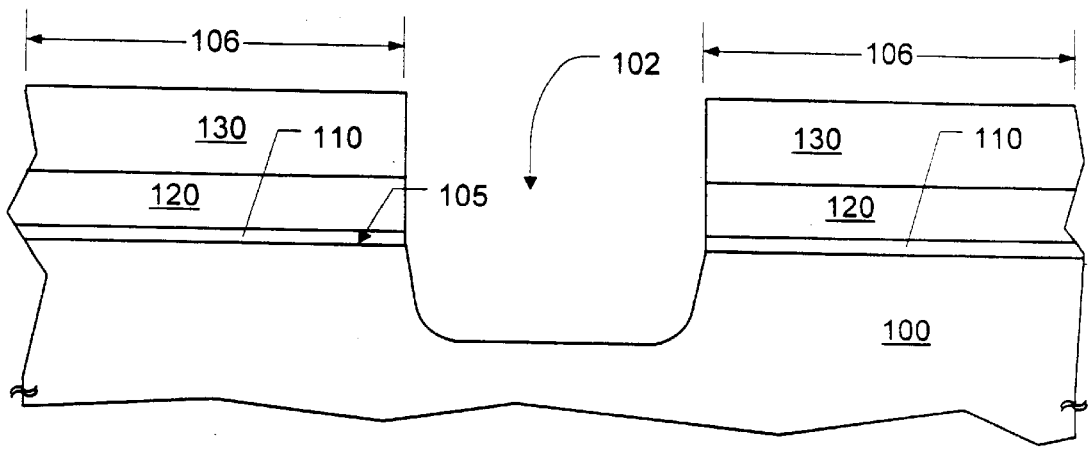

As shown in FIG. 2, a photoresist masking layer 130 is applied over the surface of nitride layer 120. Photoresist masking layer 130 is conventionally patterned to protect the active areas 106 of substrate 100 and to expose only the areas where field isolation regions are desired. The exposed areas of the oxide/nitride stack are then conventionally etched. Nitride layer 120 is etched, for example, through dry etching with $CF_4$ plasma, while pad oxide layer 110 is etched, for example, using a fluorocarbon-containing plasma. Thus, surface 105 of substrate 100 is exposed where field isolation regions are desired. Substrate 100 is then etched using a conventional reactive ion etch (RIE) process to form a trench 102 approximately 400–600 Å deep or deeper if desired. It is understood, however, that other methods of etching substrate 100 may be alternatively employed. The etching process should produce sidewalls of trench 102 that are slightly inclined away from vertical, e.g., approximately 60°, and corners at the bottom of trench 102 that are rounded to reduce stress during the subsequent field oxidation process and will prevent stacking fault type problems.

Figure 3:
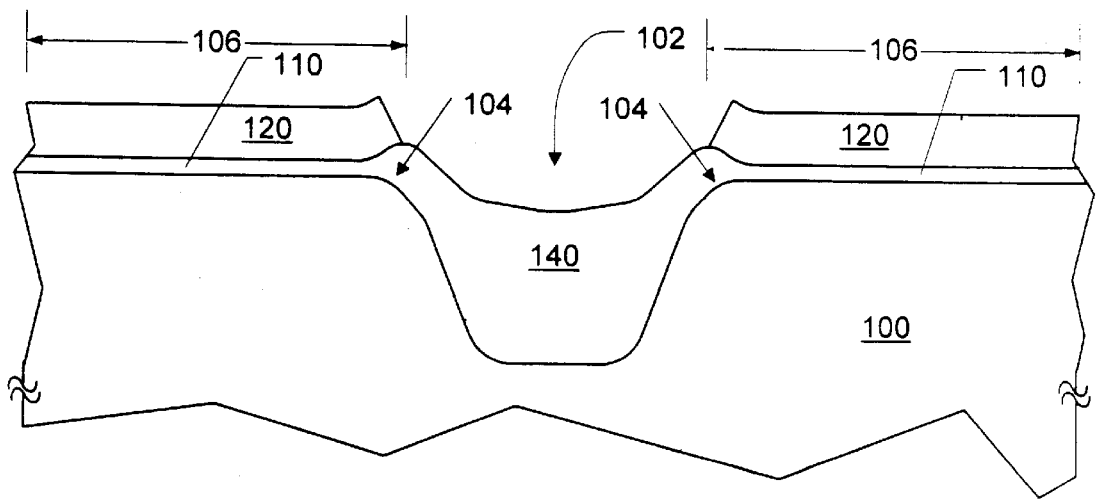

A field oxide layer 140 is grown, as shown in FIG. 3. Field oxide layer 140 is grown to approximately 2500–3000 Å thick, by oxidation of the silicon in substrate 100 in a steam environment at 1050–1100° Celsius (C) for approximately 2 hours. Pad oxide layer 110 and nitride layer 120 protect substrate 100 from oxidation during the growth of field oxide layer 140. A dry oxygen atmosphere may also be used; however, the process throughput using a steam environment is superior. A conventional high temperature anneal in an atmosphere of nitrogen can be used to eliminate any seams between the deposited pad oxide layer 110 and the grown field oxide layer 140. Although there may be a small amount of oxide growth on the nitride layer, this can be easily stripped off later.

As shown in FIG. 3, the growth of field oxide layer 140 is incomplete because it is stopped before field oxide layer 140 has completely filled trench 102 in substrate 100. The lateral encroachment of oxide beneath nitride layer 120, known as bird's beak, is minimized by using an incomplete field oxide growth at a high temperature. Thus, there is less oxide encroachment into the active areas of substrate 100, compared to a RLOCOS process, which advantageously improves scalability. The bird's beak is advantageous, however, because it rounds the corners 104 at active areas 106 and the field isolation area. Because corners 104 are rounded by field oxide layer 140, the need for an oxide liner step used in STI processing is eliminated. Further, the rounded corners 104 also prevent parasitic leakage and poor oxide quality that is associated with sharp corners. Because there is no need for an oxide liner in trench 102 and field oxide layer 140 is grown directly from the silicon in substrate 100, there is no seam in trench 102 between an oxide liner and the field oxide.

Figure 4:
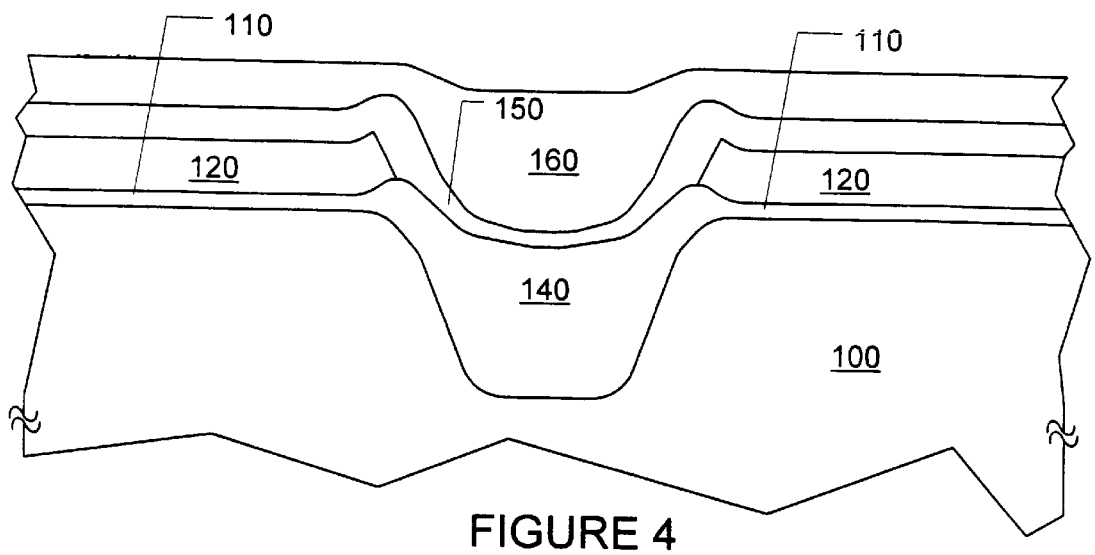

FIG. 4 shows a double oxide deposition over the surface of nitride layer 120 and field oxide layer 140. A gap fill layer 150 of high density plasma (HDP), approximately 2000 Å thick, is first deposited over nitride layer 120 and field oxide layer 140 Deposited TEOS (tetra-ethyl-ortho-silicate) may be used alternatively as gap fill layer 150. Gap fill layer 150 fills in trench 102 and prevents void formation. A TEOS/03 layer 160 is then conventionally deposited over gap fill layer 150 to approximately 1 $\mu$m thick, which is sufficient to produce an approximately planar surface. The amount of double oxide deposition required to fill trench 102 is less than that used in standard shallow trench isolation processing because most of trench 102 is already filled with field oxide layer 140 and because substrate 100 was only etched to a depth of approximately 600–800 Å compared to the trench depth of 3500 Å used in standard shallow trench isolation processing. Further, the actual depth of etched trench 102 is less than the depth of the trenches used in standard shallow trench isolation processing. Consequently, less oxide deposition is required to fill trench 102 and to obtain an approximately planar topology relative to standard shallow trench isolation.

Figure 5:
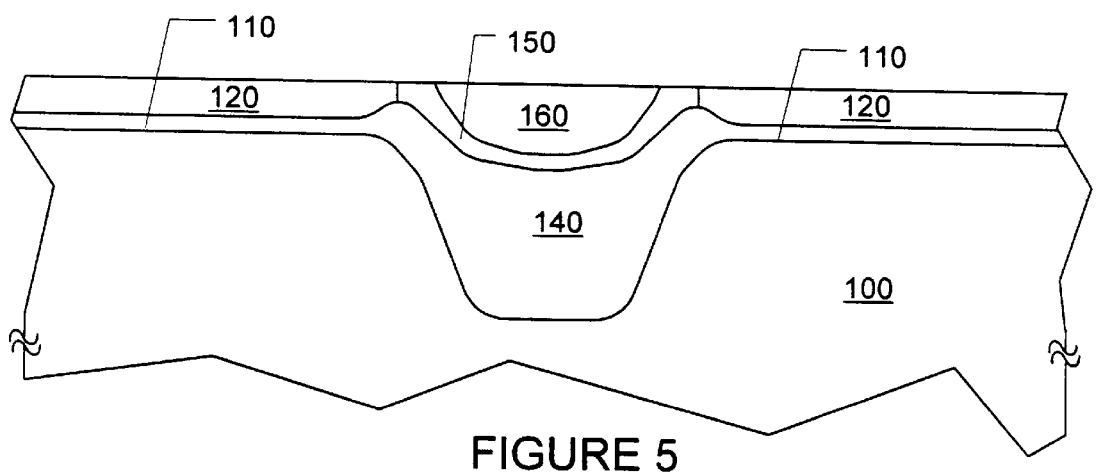

Subsequent to the deposition of TEOS/03 layer 160, a standard oxide chemical mechanical polish (CMP) is used to etch back layers 150 and 160 to nitride layer 120, as shown in FIG. 5. A reduced amount of CMP is required to planarize layers 150 and 160 with nitride layer 120, however, because the amount of double oxide deposition used is minimal relative to standard shallow trench isolation. A reduced amount of CMP is advantageous because the CMP process creates nonuniformities, such as dishing, on the surface being polished. Where extensive CMP is used small field isolation structures may be etched away. Standard shallow trench isolation processes typically use a reverse active area mask to prevent dishing. The present invention, however, advantageously limits dishing by reducing the amount of CMP required and, thus, obviates the need for a masking step.

Figure 6:
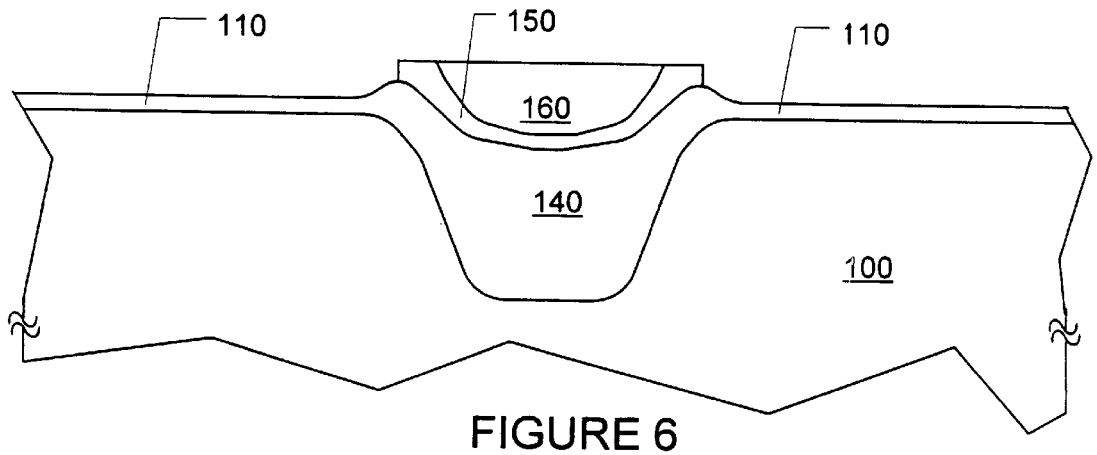
Figure 7:
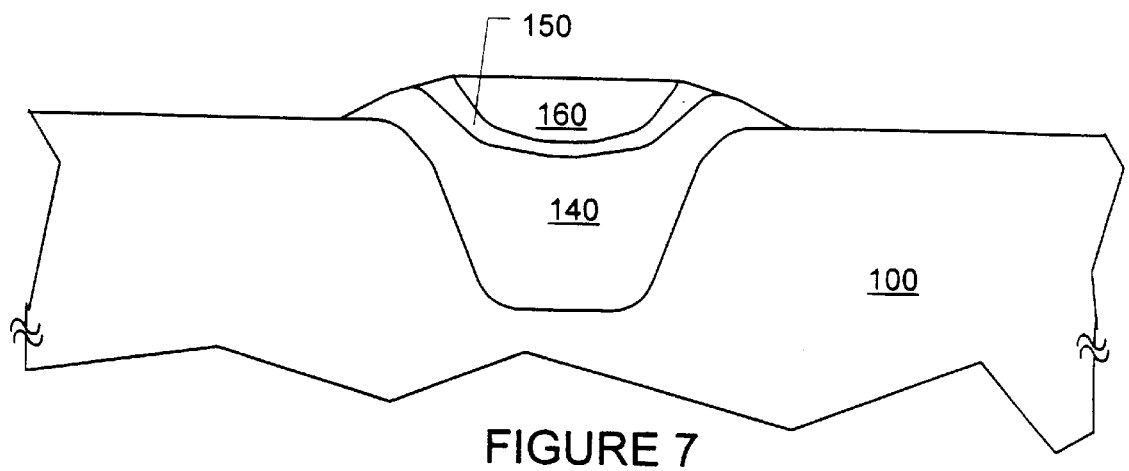
Figure 8:
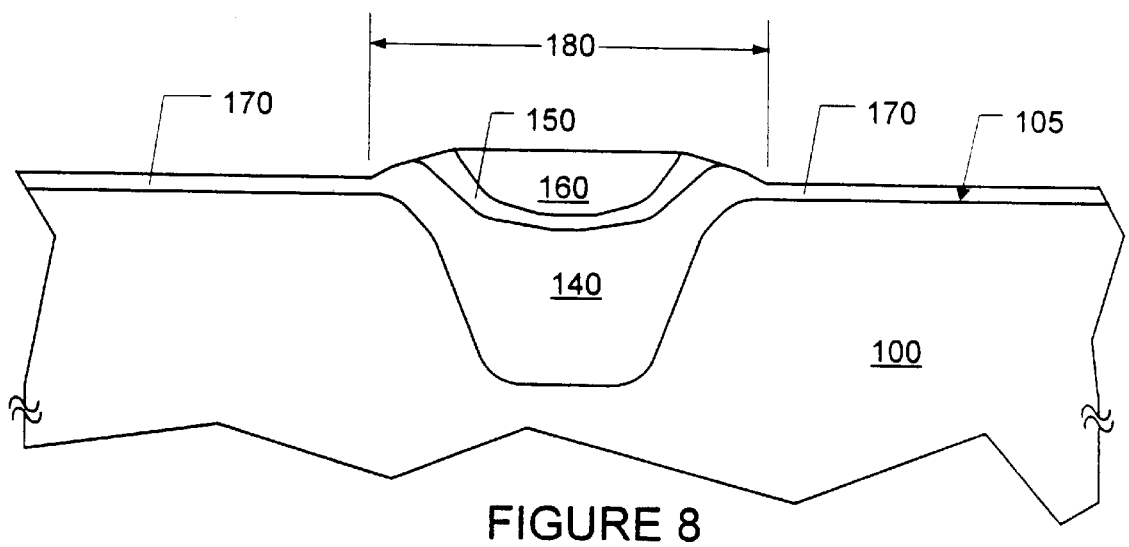

Once the layers 150 and 160 are etched back and planarized, the oxide/nitride stack on substrate 100 is conventionally stripped. FIG. 6 shows substrate 100 after a nitride etch step, which may be, for example, a dry etch using a $CF_4$ plasma. Pad oxide layer 110 is then etched, for example, with a buffered hydrofluoric acid, resulting in the structure shown in FIG. 7. FIG. 8 shows substrate 100 after a gate oxide layer 170 is conventionally grown on surface 105 of substrate 100. With field isolation region 180 thus completed, the processing of substrate 100 is continued in a conventional manner.

While the present invention has been described in connection with specific embodiments, variations of these embodiments will be obvious to those of ordinary skill in the art. It is understood that conventional process steps, such as annealing processes, are used where necessary, as is well understood in the art. Therefore, the spirit and scope of the appended claims should not be limited to the foregoing description.

What is claimed is:

1. A method of introducing an isolation region within a substrate, said method comprising:

providing a substrate;

etching a recessed trench in said substrate;

growing a field oxide layer in said recessed trench, wherein said field oxide is grown to a thickness of not less than 2500 Å, and wherein said field oxide layer does not completely fill said recessed trench;

depositing an oxide layer over the surface of said field oxide layer to completely fill said recessed trench, wherein said step of depositing an oxide layer over the surface of said field oxide layer further comprises:

depositing a first oxide layer over said field oxide layer; and depositing a second oxide layer over said first oxide layer; and etching back said oxide layer to produce an approximately planar surface.

2. The method of claim 1, wherein said providing a substrate further comprises:

providing a pad oxide layer over the surface of said substrate;

providing a nitride layer over the surface of said pad oxide layer;

providing a photoresist mask over the surface of said nitride layer, said photoresist mask exposing only the areas where it is desired to grow field oxide; and etching through said nitride layer and said pad oxide layer to said substrate.

3. The method of claim 2, further comprising:

etching back said nitride layer and said pad oxide layer to said surface of said substrate; and growing a gate oxide layer over the surface of said substrate.

4. The method of claim 1, wherein growing a field oxide layer in said recessed trench is comprised of oxidation of said substrate.

5. The method of claim 1, wherein said first oxide is comprised of a high density plasma.

6. The method of claim 1, wherein the second oxide layer is comprised of TEOS.

7. The method of claim 1, wherein etching back said oxide layer comprises a chemical mechanical polishing.

8. A method of introducing an isolation region within a substrate, said method comprising:

providing an oxide layer above the surface of a substrate, wherein said oxide layer leaves said substrate surface exposed where an isolation region is desired;

providing a nitride layer above the surface of said oxide layer, wherein said nitride layer leaves said substrate surface exposed where said isolation region is desired;

etching a recessed region into said substrate where said isolation region is desired;

providing a field oxide layer in said recessed region, wherein said field oxide layer is grown from silicon in said substrate, and wherein said field oxide layer does not completely fill said recessed region;

providing an oxide layer over the surface of said field oxide layer, wherein said oxide layer fills in said recessed region, wherein said step of providing an oxide layer over the surface of said field oxide layer comprises:

depositing a first oxide layer over said field oxide layer; and depositing a second oxide layer over said first oxide layer; and etching back said oxide layer to produce an approximately planar surface.

9. The method of claim 8, wherein said field oxide layer is grown to a thickness of not less than 2500 Å.

10. The method of claim 8, wherein providing an oxide layer and providing a nitride layer further comprises:

providing a photoresist masking layer over the surface of said nitride layer, said photoresist masking layer patterned to expose only the area of said nitride layer where an isolation region is desired;

etching through said nitride layer to expose only the area of said oxide layer where an isolation region is desired; and etching through said oxide layer to expose only the area of said substrate where an isolation region is desired.

11. The method of claim 8, wherein said first oxide layer is comprised of a high density plasma.

12. The method of claim 8, wherein the second oxide layer is comprised of TEOS.

13. The method of claim 8, wherein etching back said oxide layer comprises chemical mechanical polishing.

14. A method of introducing an isolation region within a substrate, said method comprising:

providing an oxide layer above the surface of a substrate, wherein said oxide layer leaves said substrate surface exposed where an isolation region is desired;

providing a nitride layer above the surface of said oxide layer, wherein said nitride layer leaves said substrate surface exposed where said isolation region is desired;

etching a recessed region into said substrate where said isolation region is desired wherein said walls and bottom of said recessed region are exposed silicon;

providing a field oxide layer in said recessed region, said field oxide layer is grown from said exposed silicon in said walls and bottom of said recessed region, and wherein said field oxide layer does not completely fill said recessed region;

providing an oxide layer over and in direct contact with the surface of said field oxide layer and the surface of said nitride layer, wherein said oxide layer fills in said recessed region; and etching back said oxide layer to produce an approximately planar surface.

15. The method of claim 14, wherein providing an oxide layer and providing a nitride layer further comprises:

providing a photoresist masking layer over the surface of said nitride layer, said photoresist masking layer patterned to expose only the area of said nitride layer where an isolation region is desired;

etching through said nitride layer to expose only the area of said oxide layer where an isolation region is desired; and etching through said oxide layer to expose only the area of said substrate where an isolation region is desired.

16. The method of claim 14, wherein providing an oxide layer over the surface of said field oxide layer comprises:

depositing a first oxide layer over said field oxide layer; and depositing a second oxide layer over said first oxide layer.

* * * * *